(12) United States Patent
Schwan et al.

(10) Patent No.: US 7,838,359 B2
(45) Date of Patent: Nov. 23, 2010

(54) TECHNIQUE FOR FORMING CONTACT INSULATION LAYERS AND SILICIDE REGIONS WITH DIFFERENT CHARACTERISTICS

(75) Inventors: Christoph Schwan, Gebhardshain (DE); Kai Frohberg, Niederau (DE); Matthias Lehr, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 232 days.

(21) Appl. No.: 11/379,606

(22) Filed: Apr. 21, 2006

(65) Prior Publication Data

US 2007/0001233 A1  Jan. 4, 2007

(30) Foreign Application Priority Data

Jun. 30, 2005  (DE)  ........................ 10 2005 030 583

(51) Int. Cl.
*H01L 21/8238* (2006.01)
(52) U.S. Cl. ........................ 438/233; 257/382
(58) Field of Classification Search ................. 257/382; 438/233
See application file for complete search history.

(56) References Cited

U.S. PATENT DOCUMENTS

| 4,142,004 | A * | 2/1979 | Hauser et al. ............... 438/792 |
| 5,882,973 | A | 3/1999 | Gardner et al. ............... 438/279 |
| 6,391,750 | B1 | 5/2002 | Chen et al. .................. 438/583 |
| 6,869,866 | B1 | 3/2005 | Chidambarro et al. ...... 438/581 |
| 7,112,483 | B2 * | 9/2006 | Lin et al. ..................... 438/231 |
| 2003/0162389 | A1 * | 8/2003 | Wieczorek et al. .......... 438/664 |
| 2003/0181005 | A1 | 9/2003 | Hachimine et al. .......... 438/231 |
| 2004/0029323 | A1 | 2/2004 | Shimizu et al. .............. 438/142 |
| 2004/0075148 | A1 | 4/2004 | Kumagai et al. ............. 257/369 |
| 2004/0104405 | A1 | 6/2004 | Huang et al. ................. 257/199 |
| 2004/0113217 | A1 | 6/2004 | Chidambarrao et al. ..... 257/415 |
| 2005/0051851 | A1 * | 3/2005 | Chen et al. ................... 257/369 |
| 2005/0093030 | A1 | 5/2005 | Doris et al. .................. 257/288 |
| 2005/0112817 | A1 | 5/2005 | Cheng et al. ................. 483/219 |
| 2006/0024879 | A1 * | 2/2006 | Fu et al. ...................... 438/216 |
| 2006/0163670 | A1 * | 7/2006 | Ellis-Monaghan et al. .. 257/388 |

FOREIGN PATENT DOCUMENTS

| WO | WO 03/075330 A1 | 9/2003 | .................. 21/285 |
| WO | WO 2005/010982 A1 | 2/2005 | |

OTHER PUBLICATIONS

International Search Report dated Sep. 25, 2006.

* cited by examiner

*Primary Examiner*—Thao X Le
*Assistant Examiner*—Tanika Warrior
(74) *Attorney, Agent, or Firm*—Williams, Morgan & Amerson, P.C.

(57) ABSTRACT

A technique is provided that enables the formation of metal silicide individually for N-channel transistors and P-channel transistors, while at the same time a strain-inducing mechanism is also provided individually for each transistor type. In this way, a cobalt silicide having a reduced distance to the channel region of an NMOS transistor may be provided, while a P-channel transistor may receive a highly conductive nickel silicide, without unduly affecting or compromising the characteristics of the N-channel transistor.

13 Claims, 7 Drawing Sheets

TECHNIQUE FOR FORMING CONTACT INSULATION LAYERS AND SILICIDE REGIONS WITH DIFFERENT CHARACTERISTICS

BACKGROUND OF THE INVENTION

1. Field of the Invention

Generally, the present invention relates to the formation of integrated circuits, and, more particularly, to an integration scheme for individually enhanced performance characteristics of NMOS transistors and PMOS transistors.

2. Description of the Related Art

The fabrication of integrated circuits requires the formation of a large number of circuit elements on a given chip area according to a specified circuit layout. Generally, a plurality of process technologies are currently practiced, wherein, for complex circuitry, such as microprocessors, storage chips and the like, CMOS technology is currently the most promising approach, due to the superior characteristics in view of operating speed and/or power consumption and/or cost efficiency. During the fabrication of complex integrated circuits using CMOS technology, millions of complementary transistors, i.e., N-channel transistors and P-channel transistors, are formed on a substrate including a crystalline semiconductor layer. A MOS transistor, irrespective of whether an N-channel transistor or a P-channel transistor is considered, comprises so-called PN junctions that are formed by an interface of highly doped drain and source regions with an inversely doped channel region disposed between the drain region and the source region.

The conductivity of the channel region, i.e., the drive current capability of the conductive channel, is controlled by a gate electrode formed above the channel region and separated therefrom by a thin insulating layer. The conductivity of the channel region upon formation of a conductive channel, due to the application of an appropriate control voltage to the gate electrode, depends on the dopant concentration, the mobility of the charge carriers, and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region substantially determines the performance of the MOS transistors. Thus, the reduction of the channel length, and associated therewith the reduction of the channel resistivity, renders the channel length a dominant design criterion for accomplishing an increase in the operating speed of the integrated circuits.

The reduction of the transistor dimensions, however, creates a plurality of issues associated therewith that have to be addressed so as to not unduly offset the advantages obtained by steadily decreasing the channel length of MOS transistors. One major problem in this respect is the development of enhanced photolithography and etch strategies to reliably and reproducibly create circuit elements of critical dimensions, such as the gate electrode of the transistors, for a new device generation having reduced features sizes. Moreover, highly sophisticated dopant profiles, in the vertical direction as well as in the lateral direction, are required in the drain and source regions to provide low sheet and contact resistivity in combination with a desired channel controllability. In addition, the vertical location of the PN junctions with respect to the gate insulation layer also represents a critical design criterion in view of leakage current control. Hence, reducing the channel length also requires reducing the depth of the drain and source regions with respect to the interface formed by the gate insulation layer and the channel region, thereby requiring sophisticated implantation techniques.

Irrespective of the technological approach used, sophisticated spacer techniques are necessary to create the highly complex dopant profile and to serve as a mask in forming metal silicide regions in the gate electrode and the drain and source regions in a self-aligned fashion. The metal silicide regions are provided to improve the contact resistance of the drain and source regions as well as the conductivity of the gate electrode, when formed from polysilicon, since some metal silicides exhibit an increased conductivity compared to even highly doped silicon. It turns out that different metal silicides as well as their position have different influences on the performance of NMOS transistors and PMOS transistors, respectively. For instance, locating the metal silicide region more closely to the channel region of an NMOS transistor enhances the performance thereof, while the performance of a PMOS transistor may be improved by using nickel silicide instead of cobalt silicide, which is a frequently used material. However, nickel silicide tends to form so-called "piping" defects, that is, silicide "stingers," which may extend into the channel region, thereby possibly not allowing the nickel silicide to be located near the channel region as closely as desired without unduly affecting the transistor behavior.

Since the continuous size reduction of the critical dimensions, i.e., the gate length of the transistors, necessitates the adaptation and possibly the new development of process techniques concerning the above-identified process steps, it has been proposed to enhance device performance of the transistor elements by increasing the charge carrier mobility in the channel region for a given channel length. In principle, at least two mechanisms may be used, in combination or separately, to increase the mobility of the charge carriers in the channel region. First, the dopant concentration within the channel region may be reduced, thereby reducing scattering events for the charge carriers and thus increasing the conductivity. However, reducing the dopant concentration in the channel region significantly affects the threshold voltage of the transistor device, thereby making a reduction of the dopant concentration a less attractive approach unless other mechanisms are developed to adjust a desired threshold voltage. Second, the lattice structure in the channel region may be modified, for instance by creating tensile or compressive strain, which results in a modified mobility for electrons and holes. For example, creating tensile strain in the channel region increases the mobility of electrons, wherein, depending on the magnitude of the tensile strain, an increase in mobility of up to 20% or more may be obtained, which in turn directly translates into a corresponding increase in the conductivity. On the other hand, compressive stress in the channel region may increase the mobility of holes, thereby providing the potential for enhancing the performance of P-type transistors. Consequently, it has been proposed to introduce, for instance, a silicon/germanium layer or a silicon/carbon layer in or below the channel region to create tensile or compressive stress.

Another promising approach is the creation of stress in the insulating layer, which is formed after the formation of the transistor elements to embed the transistors and which receives metal contacts to provide the electrical connection to the drain/source regions and the gate electrode of the transistors. Typically, this insulation layer comprises at least one etch stop layer or liner and a further dielectric layer that may selectively be etched with respect to the etch stop layer or liner. In the following, this insulation layer will be referred to as contact layer and the corresponding etch stop layer will be denoted as contact liner layer. In order to obtain an efficient stress transfer mechanism to the channel region of the transistor for creating strain therein, the contact liner layer that is located in the vicinity of the channel region has to be positioned closely to the channel region. In advanced transistor architectures requiring a triple spacer approach for achieving the highly complex lateral dopant profile, a significant amount of the stress of the contact liner layer is, however, "absorbed" by the spacers, thereby making conventional triple spacer approaches, despite their advantages with respect to process complexity compared to epitaxially grown stress layers, less attractive for creating strain in channel regions of advanced transistors. For this reason, in some approaches, one or more of the spacers is removed prior to the formation of metal silicides, wherein the removal process may be performed differently for PMOS and NMOS transistors, depending on the device requirements.

Consequently, a plurality of mechanisms are known, which individually may improve the performance of transistor elements, which may, however, not be compatible with currently used integration schemes, as NMOS transistors and PMOS transistors may typically require a different treatment with respect to, for instance, strained channel regions, type and location of metal silicide regions and the like.

In view of the above-described situation, there exists a need for an improved technique that enables an enhanced integration scheme to address some or all of the above-identified performance improving mechanisms.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the formation of different types of transistor elements, such as P-channel transistors and N-channel transistors, in which an enhanced performance characteristic is obtained by combining strain-creating mechanisms and silicide formation mechanisms that are individually adapted to the specific transistor element in order to obtain an overall synergetic effect.

According to one illustrative embodiment of the present invention, a method comprises forming a first transistor element comprising a first gate electrode structure including a first sidewall spacer structure having a first width. The method further comprises forming a second transistor element comprising a second gate electrode structure including a second sidewall spacer structure having a second width that differs from the first width. Moreover, a first metal silicide is formed in the first transistor element and a second metal silicide is formed in the second transistor element, wherein the first and second metal silicides differ in at least one of a material composition, a thickness and a process condition. Furthermore, a first contact liner layer is formed above the first transistor element and a second contact liner layer is formed above the second transistor element, wherein the first and second contact liner layers differ in at least one of material composition and internal stress.

According to another illustrative embodiment of the present invention, a semiconductor device comprises a first transistor element having a first gate electrode structure including a first spacer structure having a first width, and a second transistor element having a second gate electrode structure including a second spacer structure having a second width that differs from the first width. The semiconductor device further comprises a first metal silicide formed in the first transistor element, wherein the first metal silicide has a first characteristic. Furthermore, a second metal silicide is formed in the second transistor element and has a second characteristic that differs from the first characteristic. The semiconductor device further comprises a first contact liner layer having a first internal stress which is formed above the first transistor element, and also comprises a second contact liner layer that is formed above the second transistor element and has a second internal stress that differs from the first internal stress.

BRIEF DESCRIPTION OF THE DRAWINGS

The invention may be understood by reference to the following description taken in conjunction with the accompanying drawings, in which like reference numerals identify like elements, and in which:

FIGS. 1$a$-1$k$ schematically show cross-sectional views of a semiconductor device including two different transistor types during various manufacturing stages in accordance with illustrative embodiments of the present invention; and FIGS. 2$a$-2$c$ schematically show cross-sectional views of a semiconductor device during various manufacturing stages, wherein an embedded semiconductor compound for creating internal stress is formed in addition to other strain-creating mechanisms and silicide formation techniques according to further illustrative embodiments of the present invention.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention addresses the problem of efficiently transferring stress from a contact liner layer, i.e., from an etch stop layer that is used in combination with a contact dielectric layer, to the channel region of respective transistor elements, while an enhanced process flexibility in forming appropriate metal silicide regions in the respective transistor elements is provided. For this purpose, the location of a respective metal silicide region with respect to its distance from the channel region and/or the material composition or other characteristics of the metal silicide, which may be determined by the process conditions during the formation of the metal silicide, may appropriately be tailored for the respective transistor element, substantially without adversely affecting the corresponding formation of the metal silicide in the other transistor type. Thus, a different strain in the respective channel regions may be created, such as tensile strain in the channel region of an N-channel transistor and compressive strain in the channel region of a P-channel transistor, while nevertheless the respective metal silicides may be formed such that the overall performance of each transistor type may be increased even more.

With reference to the accompanying drawings, further illustrative embodiments of the present invention will now be described in more detail. FIG. 1 a schematically shows a semiconductor device 100 comprising a substrate 101, which may represent any appropriate semiconductor substrate for forming silicon-based transistor elements. Thus, the substrate 101 may represent a silicon bulk substrate or a silicon-on-insulator (SOI) substrate having formed thereon an appropriate silicon-based crystalline layer for forming respective transistor devices. In the embodiment shown in FIG. 1a, the substrate 101 represents an SOI substrate having formed thereon a first transistor element 120 and a second transistor element 140, which may be separated by an isolation structure 103, which may be provided in the form of a shallow trench isolation. In the first transistor element 120, which may represent, in one illustrative embodiment, an N-channel transistor, a gate electrode structure 121 is formed on a gate insulation layer 129, wherein the gate electrode structure 121 may be comprised of highly doped polysilicon, which is to receive a metal silicide region, as will be described later on. It should be appreciated that, in highly sophisticated applications, the gate electrode structure 121 may have a gate length, i.e., the horizontal dimension of the gate electrode structure 121 in FIG. 1 a, of 100 nm and even less, or even 50 nm and less for devices corresponding to the 90 nm technology. Formed on sidewalls of the gate electrode structure 121 is a sidewall spacer structure 122, which may be comprised, in the manufacturing stage as shown in FIG. 1 a, of at least one etch stop layer 123 and a spacer element 124. For example, the etch stop layer 123 may be comprised of silicon dioxide, while the spacer element 124 may be comprised of silicon nitride. However, other configurations may be used in which, for example, the etch stop layer 123 is comprised of silicon oxynitride or silicon nitride and the spacer element 124 is comprised of silicon oxynitride, silicon dioxide and the like. Moreover, a width 122a of the spacer structure 122 is substantially defined by the lateral extension at the foot of the spacer element 124 and is selected to specifically determine a lateral distance of a metal silicide to be formed within drain and source regions 127 with respect to a channel region 128 located between the drain and source regions 127.

Figure 1A:
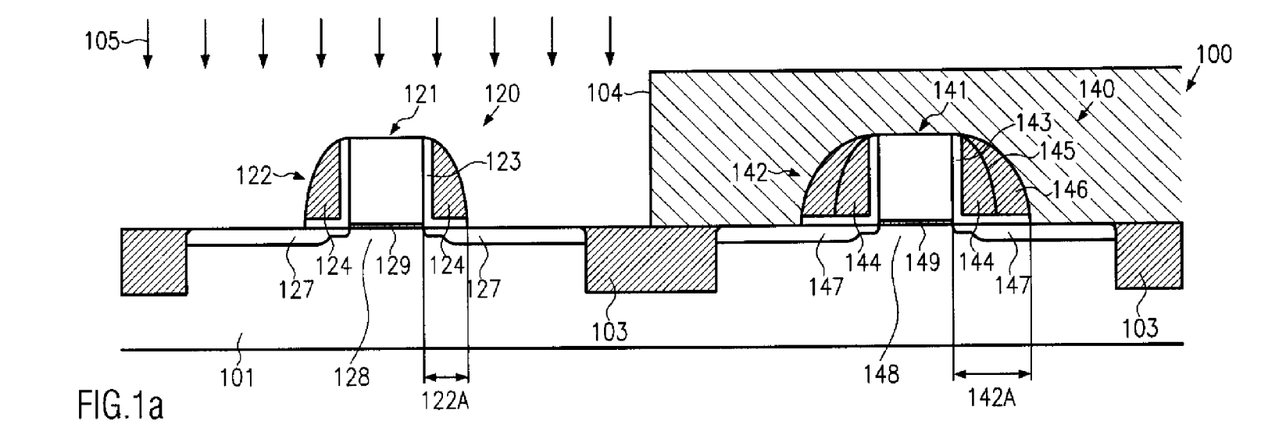

Similarly, the second transistor element 140 may comprise a gate electrode structure 141 comprised of highly doped polysilicon, which is formed on a gate insulation layer 149. A sidewall spacer structure 142 is formed at the sidewalls of the gate electrode structure 141, wherein the spacer structure 142 may comprise at least an inner spacer element 144 formed on a corresponding etch stop layer 143 and an outer spacer element 146 formed on a respective etch stop layer 145. With respect to the material composition of the etch stop layers 143, 145 and the spacer elements 144, 146, the same criteria apply as explained above for the spacer element 124 and the etch stop layer 123 of the first transistor element 120. Moreover, a width 142a of the spacer structure 142, i.e., its lateral extension at the foot of the spacer structure 142, differs from the corresponding width 122a, since the lateral distance of a metal silicide region to be formed in the second transistor element 140 may require a different value for enhanced performance of the transistor element 140, as is previously explained with respect to the different performance of NMOS and PMOS transistors in view of metal silicide.

Furthermore, the semiconductor device 100 comprises, at this stage of manufacturing, an etch mask 104 to cover the second transistor element 140 and to expose the first transistor element 120 to an etch ambient 105.

The semiconductor device 100 as shown in FIG. 1a may be formed in accordance with the following processes. After the formation of the trench isolation 103 on the basis of well-established photolithography, etch, deposition and polish techniques, a layer of gate insulation material may be formed, for instance, by advanced oxidation and/or deposition processes, to provide the required material composition and thickness as are necessary in highly advanced transistor elements. For example, a silicon dioxide based layer may be formed with a thickness of 1.5-5.0 nm in advanced applications. Thereafter, a layer of gate electrode material, such as pre-doped polysilicon, may be deposited by established process recipes, for instance involving low pressure chemical vapor deposition (CVD) and the like. Subsequently, advanced photolithography techniques in accordance with well-established recipes may be performed, followed by sophisticated etch processes in order to form the gate electrode structures 121 and 141 having the required gate lengths.

Thereafter, the spacer structures 122 and 142 may be formed in accordance with well-established processes, such as depositing corresponding etch stop layers and conformally depositing a spacer material, which is then anisotropically etched to obtain the respective spacer elements. During and after the process sequence for forming the gate electrode structures 121, 141, implantation processes may be performed to form the corresponding dopant profile for the drain and source regions 127, 147, wherein the spacer structures 122, 142 act in their corresponding manufacturing stage as respective implantation masks. It should be appreciated that, depending on the complexity of the lateral dopant profile in the drain and source regions, 127, 147, one, two, three or more individual spacer formation steps may be used. For instance, in currently advanced process strategies, a so-called triple spacer approach is frequently used. The process for forming the spacer structures 122, 142 may in some embodiments be performed substantially identically for the first and the second transistor elements 120, 140 wherein the spacer width 142a of the second transistor element is selected so as to substantially meet the requirements for a subsequent formation of metal silicide in the drain and source regions 147. For example, experimental data seem to indicate that the transistor performance of P-channel transistors may be enhanced by providing a highly conductive metal silicide, such as nickel silicide, rather than forming a cobalt silicide, even if the spacer width 142a would be reduced for cobalt silicide. A small value for the width 142a which could be used with cobalt silicide may, however, be inappropriate with nickel silicide due to the previously explained piping effect of nickel silicide. On the other hand, a reduced lateral distance of metal silicide from the channel region of an N-channel transistor may provide enhanced performance even at the cost of a reduced conductivity of the respective metal silicide so that, for instance, cobalt silicide may advantageously be used in combination with N-channel transistors, since the formation of nickel silicide may not allow as small a spacer width as desired for an N-channel configuration. Consequently, the dimension of the inner spacer element 144 and thus of the spacer element 124 may be selected such that an appropriate masking effect during the implantation sequence in combination with a desired small width 122a may be accomplished. For this purpose, the etch mask 104, for instance in the form of a resist mask, is formed in accordance with well-established photolithography techniques to enable a selective removal of outer spacer elements, such as the spacer elements 146 and the corresponding etch stop layer 145, to finally obtain the spacer structure 122 for the first transistor element 120. Corresponding recipes for the etch process 105 are well-established in the art.

Figure 1B:
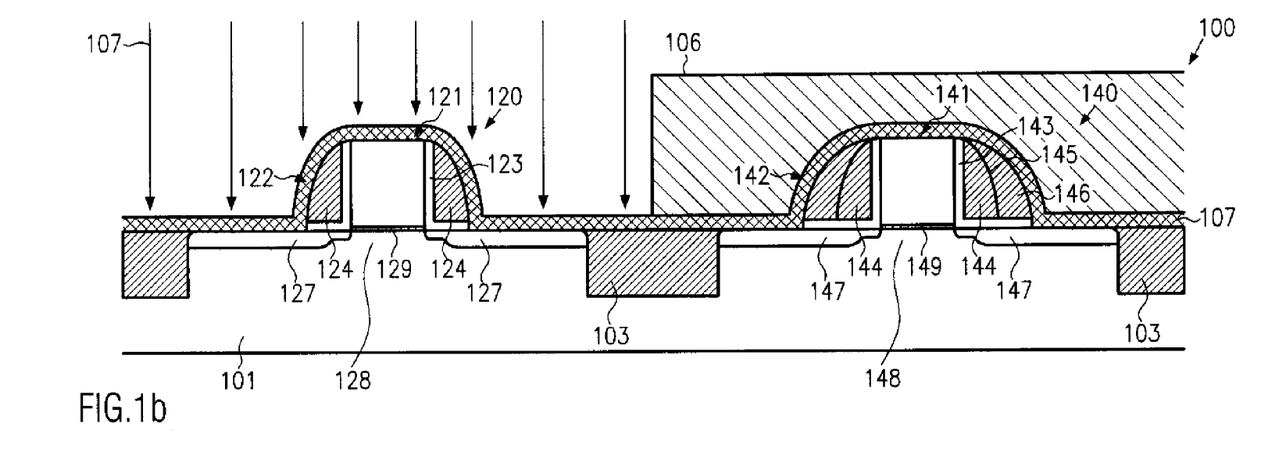

FIG. 1b schematically shows the semiconductor device 100 in a further advanced manufacturing stage. Here, an etch mask 106, for example provided in the form of a photoresist mask, is formed above the device 100 to expose a portion of a hard mask layer 107 above the first transistor element 120, while covering the portion of the hard mask layer 107 formed above the second transistor element 140. Moreover, the semiconductor device 100 is exposed to a selective etch ambient 107 for selectively removing the exposed portion of the hard mask layer 107. The hard mask layer 107 may be formed on the basis of well-established plasma enhanced CVD techniques in the form of a silicon nitride layer, a silicon dioxide layer, a silicon oxynitride layer and the like. In some embodiments, a thin etch stop layer (not shown) may be formed prior to the formation of the hard mask layer 107 to reliably stop the etch process 107 without substantially damaging sensitive areas of the first transistor element 120. For instance, a silicon dioxide layer may be deposited followed by the deposition of a silicon nitride layer as the hard mask layer 107. In this case, the etch process 107 may also include a selective etch step, which may be provided as an isotropic etch process in order to remove the etch stop layer after etching through the hard mask layer 107.

Figure 1C:
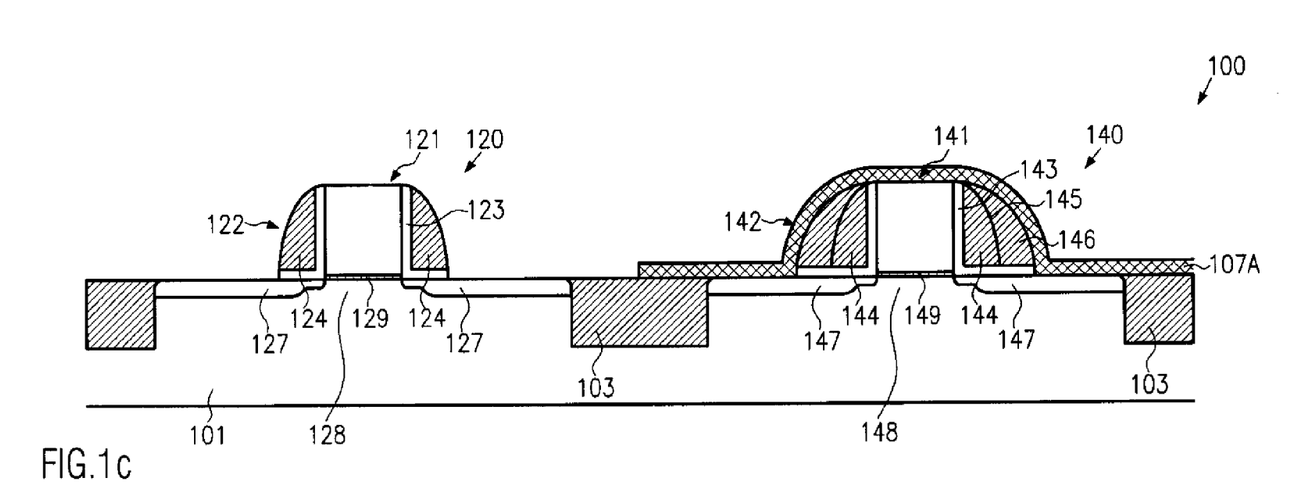

FIG. 1c schematically shows the semiconductor device 100 after the completion of the above-described etch process 107 and after the removal of the etch mask 106. Consequently, the semiconductor device 100 comprises a hard mask 107a that covers the second transistor element 140 but does not cover the first transistor element 120. In this state, a first metal silicide may be formed in the first transistor element 120, wherein the width 122a substantially determines the lateral distance of the respective metal silicide from the channel region 128. Moreover, process conditions as well as the selection of any desired metal precursor may be performed substantially without adversely affecting the second transistor element 140, which is covered by the hard mask 107a.

Figure 1D:
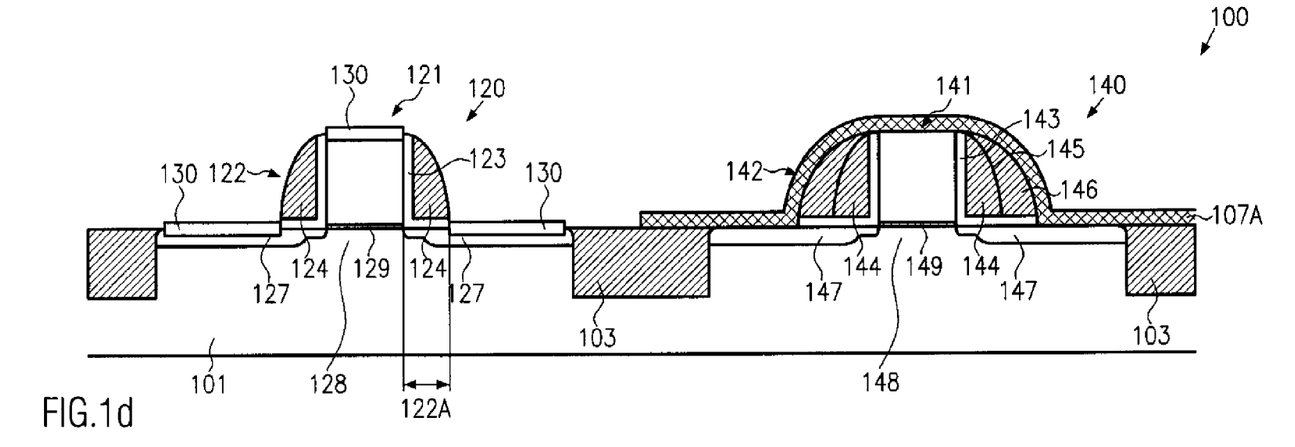

FIG. 1d schematically shows the semiconductor device 100 after the formation of a first metal silicide in the first transistor element 120. Thus, the first transistor element 120 may comprise respective metal silicide regions 130 formed in and on the drain and source regions 127 and in and on the gate electrode structure 121. In one illustrative embodiment, at least the metal silicide regions 130 formed in and on the drain and source regions 127 may be comprised of cobalt silicide, while, in other embodiments, other silicides formed from refractory metals, such as titanium, tungsten, or combinations thereof, and the like, may be provided.

The first metal silicide in the form of the regions 130 may be formed by the following process sequence. First, a cleaning process may be performed to remove any contaminants and material residues from the preceding etch and resist strip processes. Thereafter, a layer of refractory metal, such as a cobalt layer, may conformally be deposited with a specified thickness in accordance with established techniques, such as sputter deposition. Next, a first heat treatment may be carried out, wherein a process temperature and a duration of the first heat treatment are appropriately selected to initiate a chemical reaction between the cobalt and the silicon contained within the gate electrode structure 121 and the drain and source regions 127. For example, a temperature in the range of approximately 400-600° C. may be applied for several seconds up to 60 seconds, depending on the desired thickness of the regions 130. Thereafter, any non-reacted refractory metal formed on the hard mask 107a and other dielectric regions, such as the spacer structure 122 and the isolation structure 103, as well as any non-reacted refractory metal that may still be present above the gate electrode structure 121 and the drain and source regions 127 may be removed by a selective etch process, for which well-established process recipes are known in the art for materials such as cobalt, titanium, tungsten and the like.

Next, a second heat treatment may be performed with a specified higher temperature and for a specified duration in order to convert the cobalt silicide formed during the first heat treatment to a highly conductive phase comprising a significant amount of cobalt disilicide. It should be appreciated that the process conditions used during the first heat treatment and/or the second heat treatment, such as the temperature, the duration of the heat treatment, the initial thickness of the refractory metal layer, may significantly affect the characteristics of the regions 130 with respect to their electrical behavior and with respect to their performance during the further manufacturing sequence. In some embodiments, the process conditions for the formation of the first metal silicide, i.e., the regions 130, may be designed such that further processes, in particular involving further heat treatments for forming a second metal silicide in the second transistor element 140, may be taken into consideration. For instance, if the formation of the second metal silicide to be formed in the second transistor element 140 may require a heat treatment with a moderately high temperature, the second heat treatment during the formation of the regions 130 may be omitted or may correspondingly be shortened. In this way, the combined effect of a corresponding heat treatment during the formation of the second metal silicide and the process sequence prior to and during the first and, if performed, during the second heat treatment for forming the regions 130 may then in combination establish the first metal silicide in the regions 130 having the desired characteristics.

Moreover, in one illustrative embodiment, the order of forming respective metal silicide regions may be selected in accordance with the temperature required for each of the metal silicide formation processes so that the process requiring the higher anneal temperature may be performed first, thereby providing a high degree of "decoupling" in forming the first and second metal silicides. For instance, the formation of the hard mask 107a may be performed to cover the first transistor element 120 and expose the second transistor element 140, when the formation of the second metal silicide in the second transistor element 140 may require a higher anneal temperature compared to the metal silicide to be formed in the first transistor element 120. In other embodiments, the first and second transistor elements 120, 140 may receive metal silicides formed from the same precursor metal, wherein a difference in the first and second metal silicide is substantially obtained by using different process conditions and hence the order of forming the first and second metal silicides may be selected in accordance with these conditions. By way of example, the metal silicide requiring the higher anneal temperature may be formed first. Similarly, if a difference in process conditions is to be obtained by varying the anneal duration, the metal silicide requiring the shorter heat treatment may be formed last.

Figure 1E:
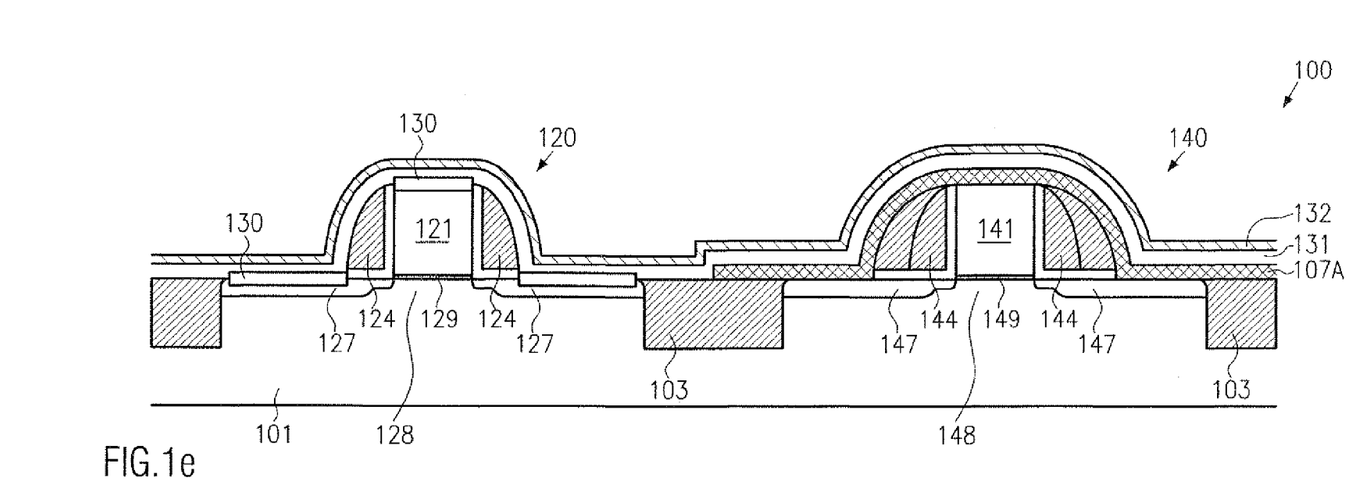

FIG. 1e schematically shows the semiconductor device 100 in a further advanced manufacturing stage. In this stage, a first contact liner layer 131, i.e., an etch stop layer used in combination with a dielectric layer to be formed to enclose the first and second transistors 120, 140, is formed above the first transistor element 120 and the second transistor element 140, which is still covered by the hard mask 107a. In one illustrative embodiment, an etch stop layer 132 is also formed on the first contact liner layer 131. For example, the first contact liner layer 131 may be comprised of any appropriate dielectric material that may be formed with a specific internal stress so as to serve as a strain-inducing layer for the first transistor element 120. In one illustrative embodiment, the first contact liner layer 131 may be comprised of silicon nitride or silicon oxynitride, for which well-established deposition recipes on the basis of plasma enhanced CVD techniques are known, wherein the internal stress of the first contact liner layer 131 may be appropriately adjusted by controlling one or more deposition parameters, such as pressure, temperature, bias power and the like, of the plasma enhanced CVD process. For example, silicon nitride may conformally be deposited with an internal stress that ranges from approximately 1.5 GPa compressive stress to approximately 1.5 GPa tensile stress. Similarly, silicon oxynitride may be formed within a wide range of compressive to tensile stress. Depending on the material composition of the first contact liner layer 131, an appropriate material having a high etch selectivity to the layer 131 may be selected so as to sufficiently protect the first contact liner layer 131 above the first transistor element 120 during an etch process for exposing the second transistor element 140 in a later stage. For instance, silicon dioxide may be selected as an appropriate material for the etch stop layer 132 when the first contact liner layer 131 is substantially comprised of silicon nitride. On the other hand, silicon nitride may be used as the etch stop layer 132 if silicon oxynitride is the material of the first contact liner layer 131.

Figure 1F:
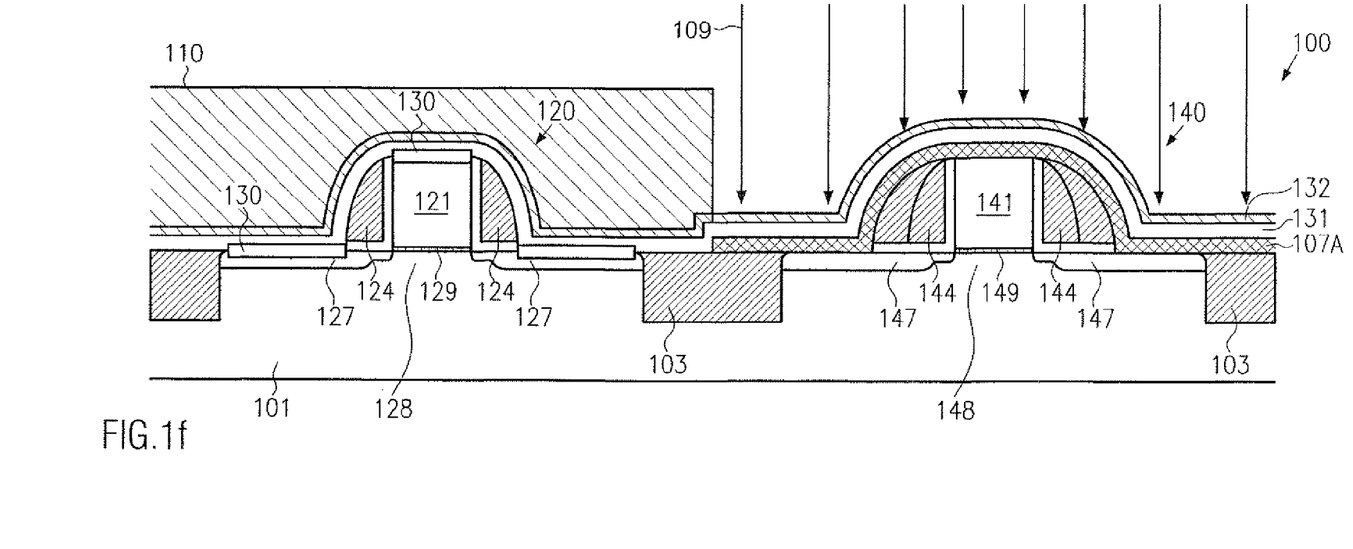

FIG. 1f schematically shows the semiconductor device 100 during an etch process 109 for exposing the second transistor element 140. Thus, the device 100 may have formed thereon an etch mask 110, which may be provided in the form of a resist mask. During the etch process 109, the etch stop layer 132, if provided, i.e., the exposed portion thereof, may be removed first by an appropriate etch chemistry. Thereafter, the first contact liner layer 131 may be removed and finally the hard mask layer 107a may be etched away on the basis of well-established recipes. In some embodiments, as previously explained, an additional etch stop layer (not shown) may have been provided prior to the formation of the hard mask 107a, which may now be used during the removal of the hard mask 107a to avoid undue damage in the underlying second transistor element 140.

Figure 1G:
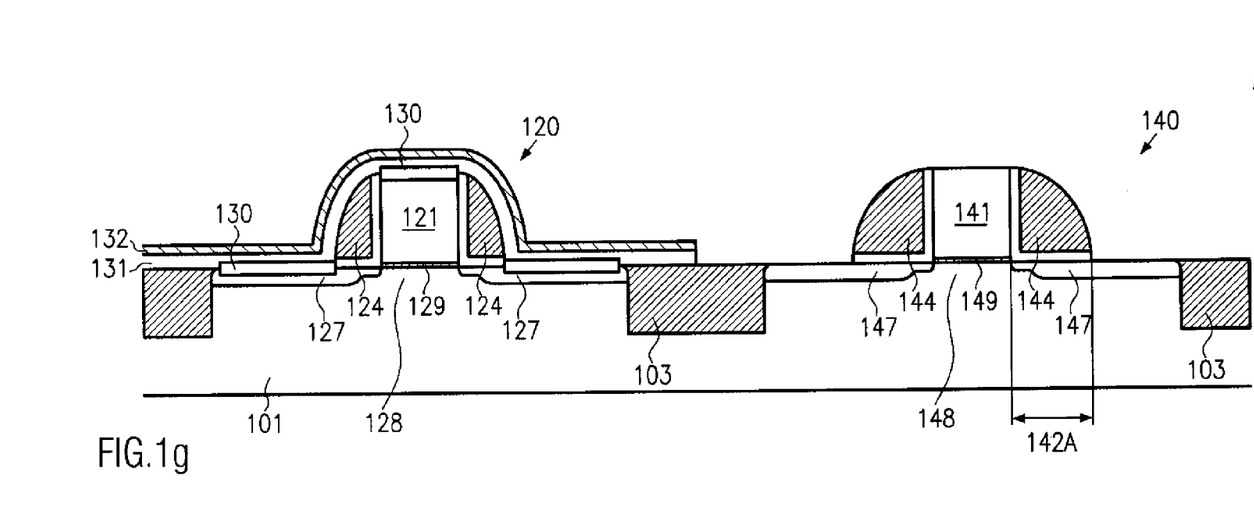

FIG. 1g schematically shows the semiconductor device 100 after the completion of the etch process 109 and after the removal of the etch mask 110. Hence, the first transistor element 120 comprises the first contact liner layer 131 having the first internal stress and optionally the etch stop layer 132 formed thereon. On the other hand, the second transistor element 140 having the spacers 144, 146 is exposed and may have been subjected to a preceding cleaning process for removing any contaminants and material residues resulting from the previously performed etch process 109.

Figure 1H:
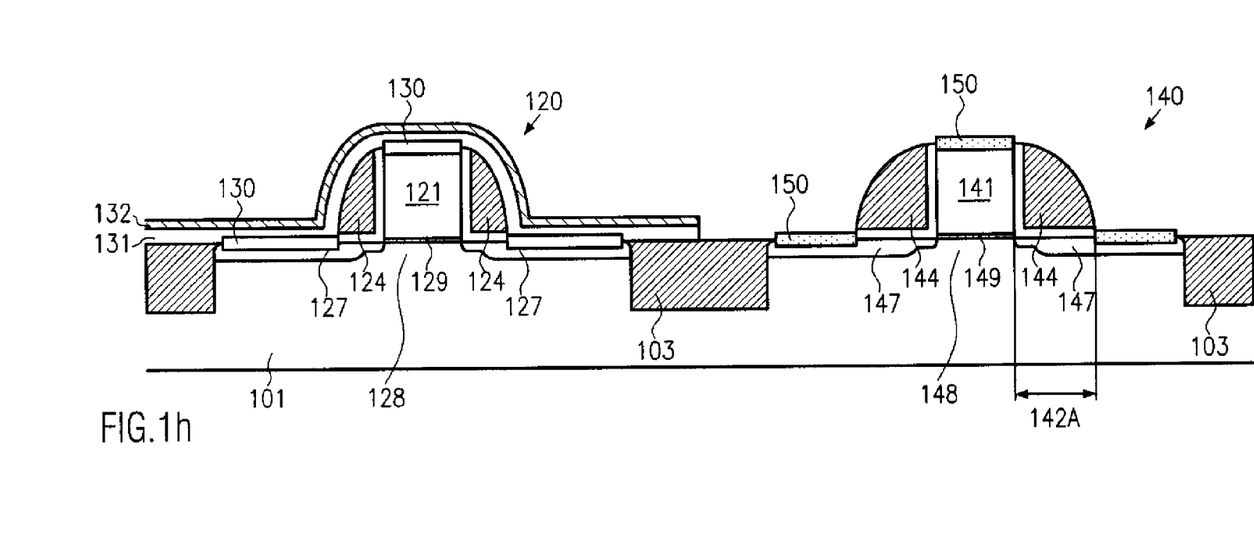

FIG. 1h schematically shows the semiconductor device 100 with a second metal silicide in the form of metal silicide regions 150 formed in the second transistor element 140. The metal silicide regions 150 may be comprised of a material that differs from that of the respective metal silicide regions 130, at least regarding the metal silicide regions 150 formed in the drain and source regions 147 and the metal silicide regions 130 formed in the drain and source regions 127, when a process strategy is used, in which the metal silicide in the drain and source region 127 and in the gate electrode structure 121 is formed in separate steps. In some embodiments, the metal silicides 150 and 130 may differ in thickness so that a depth in the corresponding drain and source regions 127 and 147 and/or the corresponding gate electrode structures 121 and 141 may also be adjusted in a transistor-specific manner. In one illustrative embodiment, the metal silicide regions 150 may be comprised of nickel silicide, wherein a lateral distance of the regions 150 with respect to the channel region 148 is substantially determined by the width 142a so as to provide a sufficient safety margin in view of the piping effect frequently observed with nickel silicide. In other embodiments, the metal silicide regions 150 may be comprised of other materials, such as cobalt silicide, titanium silicide, tungsten silicide and the like. As previously explained, however, the regions 150 formed in the drain and source regions 147 differ from the corresponding metal silicide regions 130 in at least one characteristic to provide an individual adaptation and performance increase for each of the transistor elements 120, 140.

The second metal silicide regions 150 may be formed in accordance with well-established processes, for instance by depositing a layer of refractory metal and heat treating the device 100 as is required for initiating a chemical reaction with the underlying silicon in accordance with device requirements. Regarding the selection of appropriate process conditions for the formation of the second metal silicide regions 150, such as initial layer thickness of the refractory metal, anneal temperature, anneal duration and the like, the same criteria apply as previously explained with reference to the first metal silicide regions 130. In one illustrative embodiment, nickel silicide may be formed by a CVD-like technique, in which a gaseous precursor, such as nickel tetra carbonyl ($Ni(CO)_4$)) may be provided in a deposition ambient at an elevated temperature of approximately 250-400° C. Subsequently, further anneal cycles may be performed to stabilize the metal silicide in the regions 150. In other process strategies, a second anneal cycle for converting the metal silicide into a highly conductive phase may be required, depending on the material used. For instance, when using cobalt or titanium, a second anneal process is carried out after the removal of any non-reacted metal, thereby creating the highly conductive metal silicide phase. As previously discussed, if a significant influence of the process for forming the second metal silicide regions 150 on the first metal silicide regions 130 is not desired, the second metal silicide is selected so as to require a lower anneal temperature compared to the first metal silicide. For instance, in the illustrative embodiment, in which nickel silicide is formed in the regions 150, the required anneal temperature of approximately 250-400° C. may be significantly less than a corresponding anneal temperature for forming the first metal silicide regions 130, if for instance comprised of cobalt silicide.

Figure 1I:
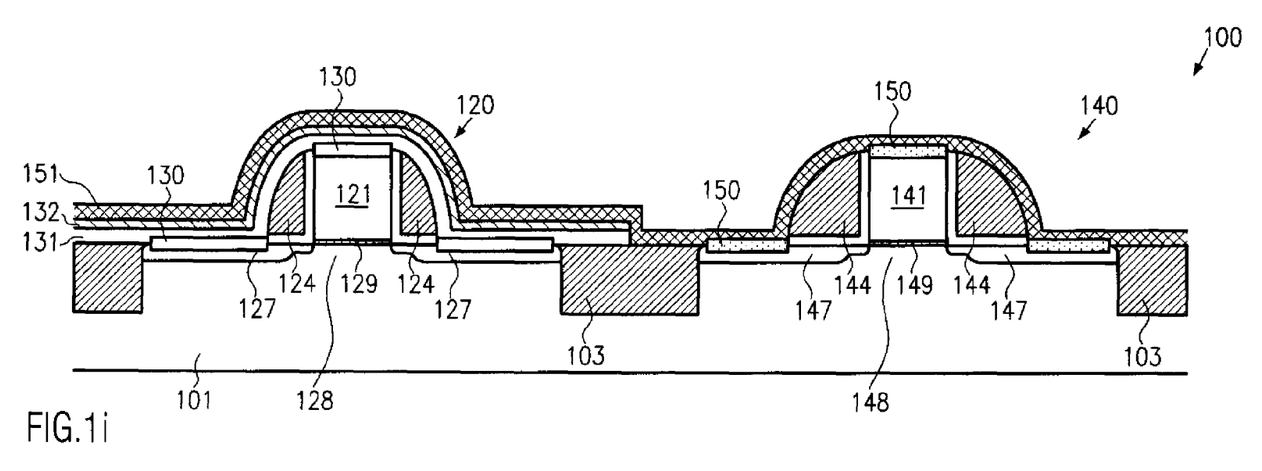

FIG. 1*i* schematically shows the semiconductor device 100 with a second contact liner layer 151 formed above the first and second transistor elements 120, 140. The second contact liner layer 151 may exhibit a specific internal stress, which is different from the respective internal stress of the first contact liner layer 131. In one illustrative embodiment, the second contact liner layer 151 is formed with compressive stress so as to provide a compressive strain within the channel region 148 of the transistor 140. In some illustrative embodiments, the outer spacer element 146 or both spacer elements 144, 146 may be removed prior to forming the second contact liner layer 151 so as to enhance the stress transfer efficiency. As previously explained with reference to the first contact liner layer 131, appropriate process recipes for generating internal stress in a dielectric layer are well-established in the art and may effectively be used in forming the second contact liner layer 151. For instance, the second contact liner layer 151 may be comprised of silicon nitride, silicon oxynitride and the like, wherein the first and second contact liner layers 131, 151 may be formed of similar or different materials, depending on process and device requirements. In some embodiments, the internal stress of the first contact liner layer 131 may be selected such that a desired strain in the channel region 128 is created in combination with the second contact liner layer 151. That is, if the layer 131 is formed to exhibit a tensile stress, while the layer 151 exhibits a compressive stress, the tensile stress in the layer 131 may be selected sufficiently high so as to significantly "over compensate" the compressive stress of the layer 151, thereby finally inducing the desired strain in the channel region 128. In other embodiments, the internal stress of the portion of the second contact liner layer 151 formed above the first transistor element 120 may be modified in order to substantially suppress any influence on the internal stress of the layer 131.

Figure 1J:
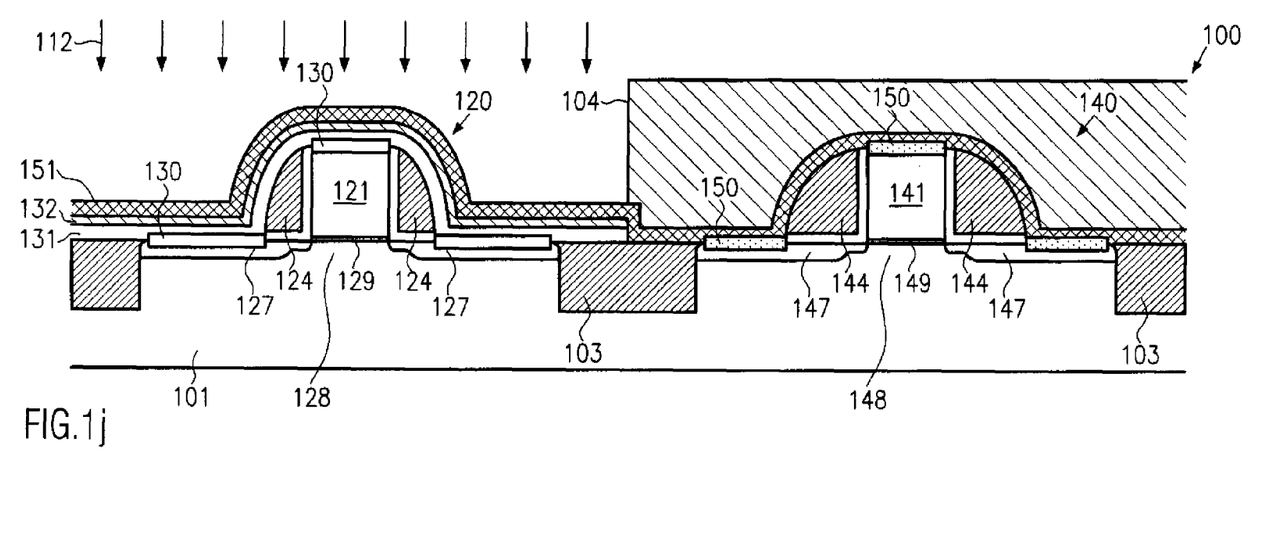

FIG. 1*j* schematically shows the semiconductor device 100 according to one illustrative embodiment, in which the internal stress of the second contact liner layer 151 is efficiently modified to reduce its influence on the first transistor element 120. For this purpose, a mask 111, such as a resist mask, may be formed which covers the second transistor element 140 while exposing the first transistor element 120. The device 100 may be subjected to a treatment 112, which may represent, in one illustrative embodiment, a selective etch process for removing the exposed portion of the second contact liner layer 151, wherein the etch front may reliably be stopped within the etch stop layer 132. In other illustrative embodiments, the treatment 112 may comprise an ion bombardment, such as an ion implantation with an appropriate ion species, such as xenon, argon, germanium and the like, which are implanted into the exposed portion of the layer 151, thereby substantially relaxing the internal stress thereof by severely damaging the crystalline structure of the layer 151. An appropriate set of implantation parameters may readily be established on the basis of simulation calculation in order to avoid undue penetration of the first contact liner layer 131.

Figure 1K:
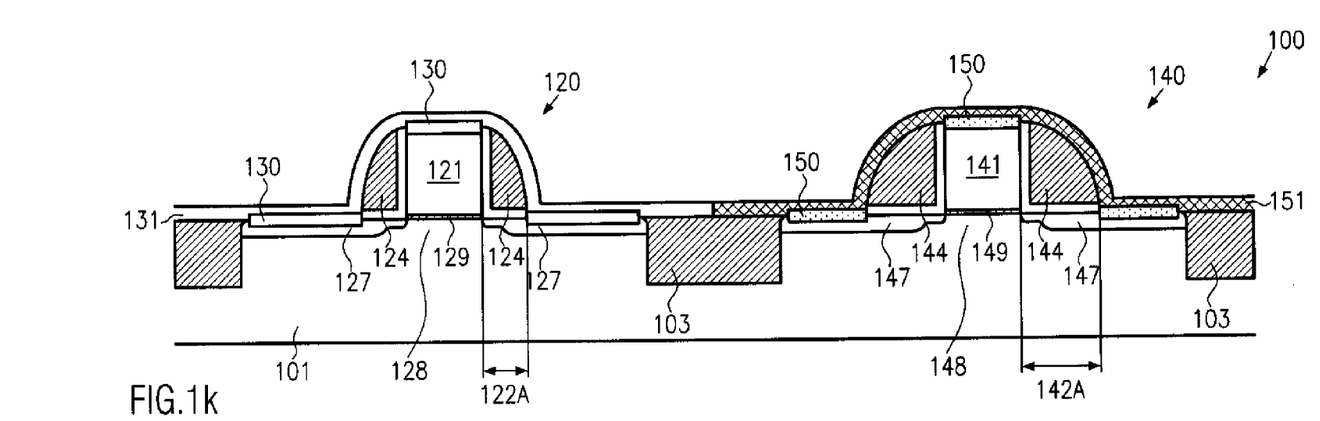

FIG. 1*k* schematically shows the semiconductor device 100 after the completion of the treatment 112, wherein, in the embodiment shown, the second contact liner layer 151 formed above the first transistor element 120 has been removed as a result of the treatment 112. Thus, the device 100 comprises the transistor 120 having formed therein a first metal silicide in the form of the regions 130, which may be comprised of a metal silicide that is appropriate for being formed close to the channel region 128, while the second transistor element 140 comprises a second metal silicide in the form of the regions 150, which are laterally spaced apart from the respective channel region 148 substantially according to the width 142*a*. In illustrative embodiments, the regions 130 may be comprised of cobalt silicide, while the regions 150 may be comprised of nickel silicide, whereas, in other embodiments, any other appropriate combination may be selected as long as the characteristics of the respective regions 130, 150 are individually adapted to the device requirements of the respective transistor elements 120, 140. Moreover, the first contact liner layer 131 induces a desired first strain in the channel region 128, such as a tensile strain, when the transistor 120 represents an N-channel transistor, while the second contact liner layer 151 provides for a different strain in the respective channel region 148 in accordance with device requirements of the transistor 140. Consequently, transistor performance for N-channel transistors and P-channel transistors may individually be increased by forming the metal silicide regions and the respective strain-inducing layers according to the process strategy described above, thereby also maintaining a high degree of process flexibility without undue mutual interaction of the processes for forming the first and second metal silicides. It should be appreciated that in the above-described illustrative embodiments, the first or the second contact liner layer 131, 151 may be used as a mask during the formation of the respective metal silicide of the non-covered transistor element, thereby in total merely requiring a single hard mask for forming the first one of the metal silicide regions (i.e., the hard mask 107*a* in FIG. 1*c*). In other approaches, a corresponding hard mask may be formed prior to each of the formation sequences for forming the respective metal silicide regions, if an exposure of the first or second contact liner layer to the process conditions for forming a metal silicide is considered inappropriate. For example, in FIG. 1*e*, the layer 131 may be considered as a hard mask layer, which may then be patterned to expose the second transistor element 140 and which may then be removed after the formation of the metal silicide regions 150. Thereafter, any appropriate process sequence may be performed to form differently stressed first and second contact liner layers, thereby providing a high degree of compatibility with conventional process strategies.

Figure 2A:
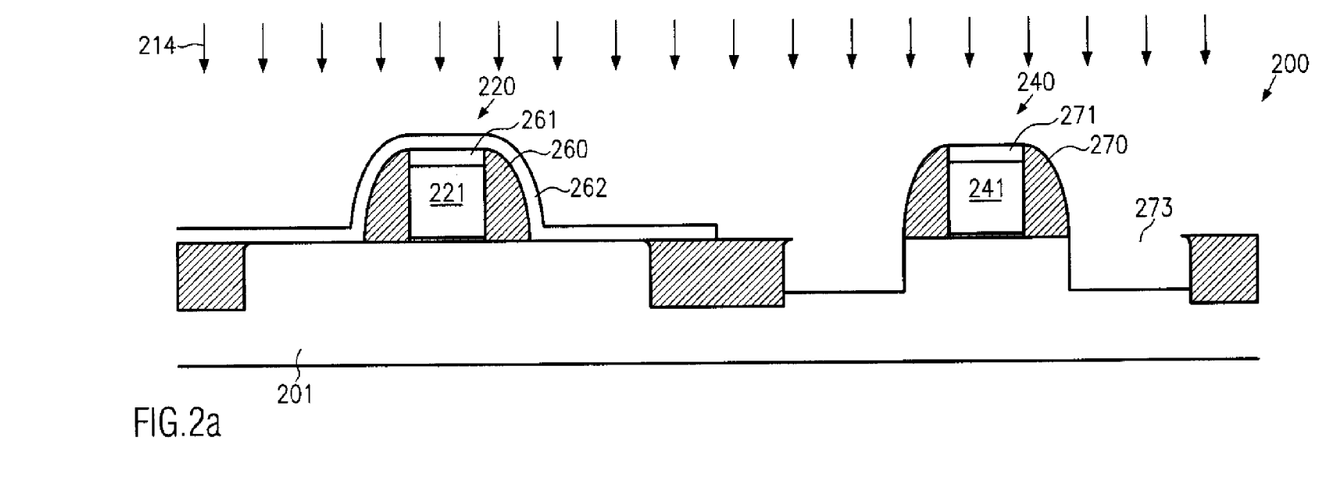
Figure 2B:
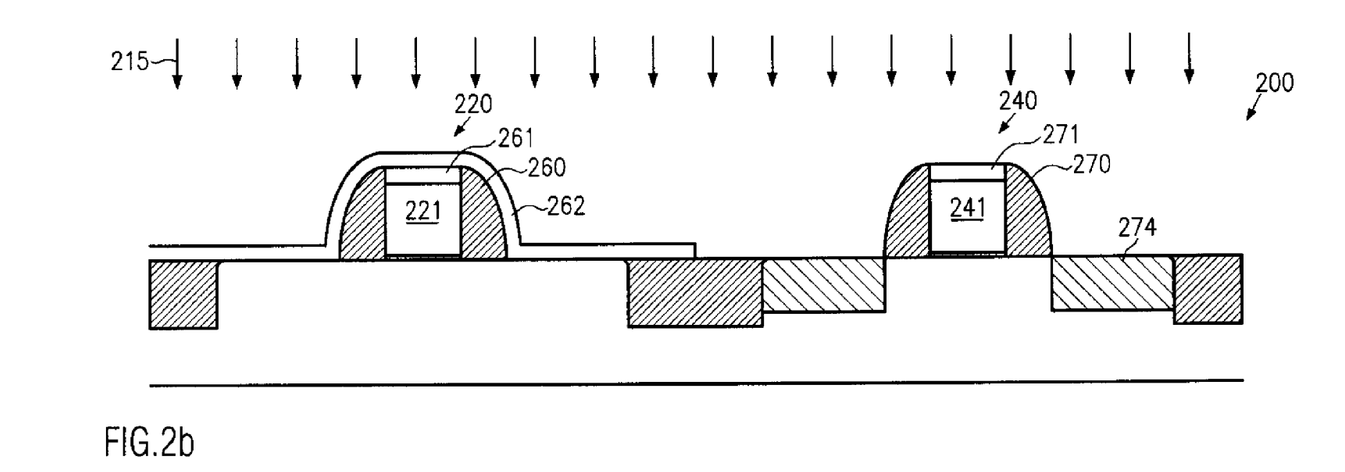
Figure 2C:
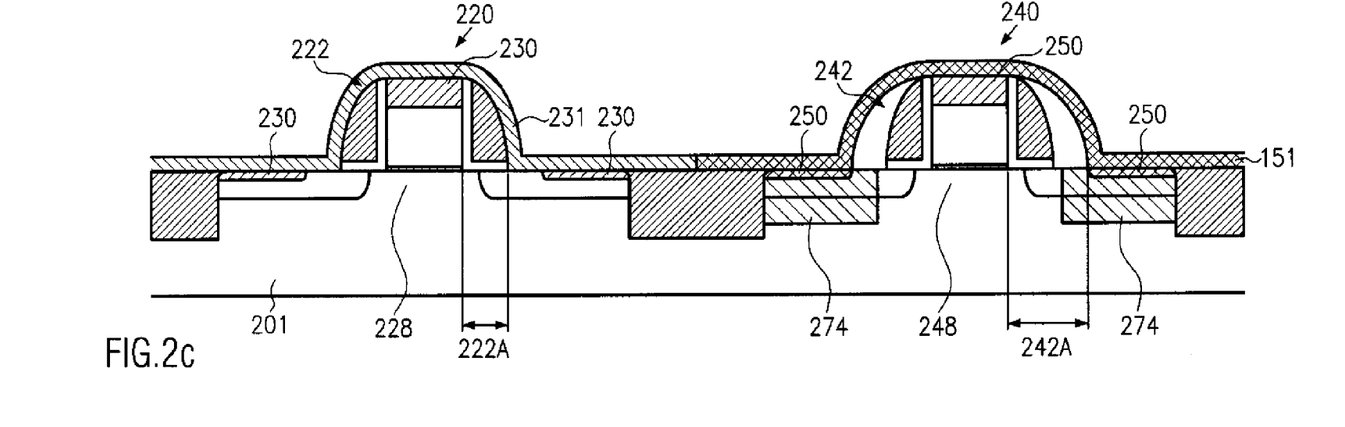

With reference to FIGS. 2*a*-2*c*, further illustrative embodiments of the present invention will now be described in more detail, in which an additional strain-inducing mechanism may be incorporated to even further enhance the overall performance of transistor elements.

In FIG. 2*a*, a semiconductor device 200 comprises a first transistor element 220 and a second transistor element 240 at an initial manufacturing stage. In the embodiment shown, the first transistor element 220 may represent an N-channel transistor, while the second transistor element 240 may represent a P-channel transistor. The first transistor element 220 may comprise a gate electrode structure 221 which is enclosed by disposable spacers 260, a cap layer 261 and a hard mask 262. Similarly, the second transistor element 240 may comprise disposable spacers 270 and a cap layer 271. Moreover, the device 200 may be subjected to an anisotropic etch process 214 to form recesses 273 adjacent to the disposable spacers 270.

The device 200 as shown in FIG. 2*a* may be formed in accordance with well-established processes, comprising the patterning of the gate electrode structures 221, 241 followed by a spacer formation process and a corresponding deposition of a hard mask layer, which may then be patterned by photolithography and anisotropic etch to obtain the hard mask 262. Thereafter, the etch process 214 may be performed on the basis of well-established etch techniques, wherein the disposable spacers 270, the cap layer 271, as well as the hard mask 262, act as an etch mask. Thereafter, the device 200 may be subjected, after any pre-cleaning processes, to a selective epitaxial growth process.

FIG. 2b schematically shows the device 200 during a selective epitaxial growth process 215 to grow a semiconductor compound within the recesses 273, thereby creating a strained embedded semiconductor region 274. In illustrative embodiments, when the second transistor 240 represents a P-channel transistor, the semiconductor compound 274 may be comprised of a mixture of silicon and germanium, thereby forming a region of compressive stress, which results in an efficient creation of compressive strain below the gate electrode structure 241. It should be appreciated, however, that, according to device requirements, other semiconductor compounds, such as silicon and carbon and the like, may be formed in order to establish a desired type of strain in the respective channel region. Appropriate selective epitaxial growth recipes are well-established in the art and may effectively be used during the process 215. Thereafter, the disposable spacers 270, the hard mask 262 and the disposable spacers 260 may be removed and the further processing of the device 200 may be continued similarly as is described with reference to FIGS. 1a-1k. That is, different metal silicide regions may be formed in the first and second transistor elements having the desired distance to respective channel regions and additionally respective contact liner layers of different internal stress may be formed.

FIG. 2c schematically shows the device 200 after a corresponding process sequence, as is described with reference to FIGS. 1a-1k. Hence, the first transistor element 220 may comprise a spacer structure 222 having a width 222a, which substantially defines a lateral distance of a first metal silicide region 230 with respect to a channel region 228. The first metal silicide region 230 may be comprised of titanium silicide, cobalt silicide and other materials, which may allow a moderately small width 222a so as to enhance the performance of an N-channel transistor. Moreover, the transistor 220 may comprise a first contact liner layer 231 having a specified internal stress, such as a tensile stress, in order to create a desired strain in the channel region 228. Similarly, the second transistor element 240 may comprise a spacer structure 242 having a width 242a, which may differ from the width 222a. In the illustrative embodiment in which the transistor element 240 represents a P-channel transistor, the width 242a may be greater than the width 222a, thereby providing a sufficient distance for a second metal silicide region 250 in the form of nickel silicide from the respective channel region 248, thereby providing enhanced performance for a P-channel transistor. The metal silicide region 250 may be formed within the epitaxially grown embedded semiconductor region 274, which also provides enhanced strain in the channel region 248. Thus, in the case of a P-channel transistor, the silicon/germanium mixture in the region 274 may create additional compressive strain in the channel region 248. Moreover, a second contact liner layer 251 may be provided having a specific internal stress, which may also significantly contribute to the total strain in the channel region 248.

Consequently, the device 200 may exhibit enhanced performance characteristics compared to conventional CMOS devices with P-channel transistors having formed therein an embedded epitaxially grown semiconductor region. Moreover, due to the characteristics of nickel silicide, the regions 250 may be efficiently formed within the silicon/germanium region 274, while at the same time a cobalt silicide may be formed in the regions 230.

As a result, the present invention provides an enhanced technique for forming strained transistor elements of different types, wherein additionally the corresponding metal silicide regions are specifically tailored with respect to a further performance enhancement. For this purpose, a process strategy is provided that enables the formation of different types of metal silicides, while still the strain-inducing mechanism may be used individually for each transistor type. Hereby, the metal silicide formation may include a different lateral position of the metal silicide regions in the first and second transistor types, thereby providing enhanced design flexibility. For instance, NMOS transistors requiring a short distance between the metal silicide and the channel region may be formed along with PMOS transistors, requiring a high conductivity of the metal silicide, which may be accomplished by the provision of nickel silicide, which on the other hand necessitates a significantly large distance between the metal silicide and the channel region.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising: forming a first transistor element comprising a first gate electrode structure including a first sidewall spacer structure having a first width; forming a second transistor element comprising a second gate electrode structure including a second sidewall spacer structure having a second width other than said first width; forming a hard mask to expose said first transistor element and cover said second transistor element; forming a first metal silicide in said first transistor element using said hard mask; forming a first stress-inducing contact liner layer above said first transistor element and said second transistor element after forming said first metal silicide; selectively removing said first stress-inducing contact liner layer above said second transistor element using said hard mask; removing said hard mask above said second transistor element; forming a second metal silicide in said second transistor element after forming said first stress-inducing contact liner; and forming a second contact liner layer above said first and second transistor elements, said first stress-inducing contact liner layer and said second contact liner layer differing in at least one of material composition and or internal stress.

2. The method of claim 1, wherein forming said first and second transistor elements comprises forming said first and second gate electrode structures each comprising at least an inner and an outer spacer element and selectively removing the outer spacer element of said first gate electrode structure.

3. The method of claim 2, further comprising removing said outer spacer element of said second sidewall spacer structure after the formation of said second metal silicide.

4. The method of claim 3, wherein forming said first metal silicide comprises depositing a cobalt layer and initiating a chemical reaction with silicon prior to forming said second metal silicide.

5. The method of claim 4, wherein forming said second metal silicide comprises forming a nickel silicide after the formation of said first metal silicide.

6. The method of claim 1, wherein forming said first and second metal silicides comprises selecting at least one of a layer thickness of refractory metal, a heat treatment temperature and a heat treatment duration differently for said first and second metal silicides.

7. The method of claim 1, further comprising selectively removing said hard mask and said first stress-inducing contact liner layer above said second transistor element, forming said second metal silicide and depositing said second contact liner layer.

8. The method of claim 7, further comprising forming an etch stop layer prior to depositing said second contact liner layer.

9. The method of claim 8, further comprising selectively removing said second contact liner layer above said first transistor element.

10. The method of claim 1, further comprising forming an embedded compound semiconductor region in a drain and source region of at least one of the first or second transistor elements.

11. The method of claim 10, wherein said embedded compound semiconductor region is formed in said drain and source region of said second transistor element.

12. The method of claim 11, wherein said embedded compound semiconductor region comprises a silicon/germanium mixture.

13. The method of claim 1, wherein the first transistor element represents an n-channel transistor and the first metal silicide comprises cobalt silicide, and the second transistor element represents a p-channel transistor and the second metal silicide comprises nickel silicide.

* * * * *